United States Patent [19]
Carbin et al.

[11] Patent Number: 6,117,300
[45] Date of Patent: Sep. 12, 2000

[54] METHOD FOR FORMING CONDUCTIVE TRACES AND PRINTED CIRCUITS MADE THEREBY

[75] Inventors: Derek Carbin, Bennington, Vt.; Wendy A. Herrick, Clifton Park, N.Y.

[73] Assignee: Honeywell International Inc., Morris Township, N.J.

[21] Appl. No.: 09/113,043

[22] Filed: Jul. 9, 1998

Related U.S. Application Data

[63] Continuation-in-part of application No. 08/846,380, Apr. 30, 1997, abandoned.
[60] Provisional application No. 60/016,665, May 1, 1996.
[51] Int. Cl.[7] .................................................... C25D 5/02
[52] U.S. Cl. ............................ 205/125; 156/151; 216/18; 29/846
[58] Field of Search ........................... 205/125; 156/151; 216/18; 29/846

[56] References Cited

U.S. PATENT DOCUMENTS

| | | | |
|---|---|---|---|
| 3,469,982 | 9/1969 | Celeste | 430/256 |
| 3,857,681 | 12/1974 | Yates et al. | 428/554 |
| 3,981,691 | 9/1976 | Cuneo | 428/626 |
| 3,984,598 | 10/1976 | Sarazin et al. | 428/336 |
| 3,998,601 | 12/1976 | Yates et al. | 428/607 |
| 4,049,431 | 9/1977 | Hagel et al. | 148/326 |
| 4,049,481 | 9/1977 | Morisaki | 156/151 |
| 4,082,620 | 4/1978 | Skurkiss | 205/135 |
| 4,088,544 | 5/1978 | Hutkin | 428/545 |
| 4,705,592 | 11/1987 | Bahrle et al. | 216/18 |
| 4,808,967 | 2/1989 | Rice et al. | 338/309 |
| 4,863,808 | 9/1989 | Sallo | 428/601 |
| 5,017,271 | 5/1991 | Whewell et al. | 205/125 |
| 5,242,562 | 9/1993 | Beyerle et al. | 204/206 |
| 5,243,320 | 9/1993 | Clouser et al. | 338/308 |
| 5,366,814 | 11/1994 | Yamanishi et al. | 428/607 |
| 5,389,446 | 2/1995 | Yamanishi et al. | 428/472 |
| 5,403,672 | 4/1995 | Urasaki et al. | 428/607 |
| 5,437,914 | 8/1995 | Saida et al. | 428/209 |
| 5,456,817 | 10/1995 | Hino et al. | 205/125 |
| 5,482,784 | 1/1996 | Ohara et al. | 428/607 |
| 5,681,443 | 10/1997 | Ameen et al. | 205/125 |

FOREIGN PATENT DOCUMENTS

| | | |
|---|---|---|
| 0 298 422 | 1/1989 | European Pat. Off. . |
| 0 398 721 | 11/1990 | European Pat. Off. . |
| 1008694 | 4/1989 | Japan . |
| 1124286 | 8/1989 | Japan . |
| 690691 | 4/1953 | United Kingdom . |
| WO 97/41713 | 11/1997 | WIPO . |

OTHER PUBLICATIONS

IBM Technical Disclosure Bulleting, vol. 32, No. 6B, Nov. 1989.

Ohr, "Electroprocessing shrinks lines widths cleanly in microcircuits", *Electronic Design*, vol. 28, p. 26 (1980).

Bucci, et al., "Copper Foil Technology, After Base Foil Production, the Base Material is Subjected to A Variety of Treatment Process." *PC Fab*, pp. 22–33 (1986).

Bupp et al., "High–Density Board Fabrication Techniques", *IBM J. Res. Develop.*, vol. 26, pp. 306–317 (1982).

"Soviets Offer PCB Technology", *Electronic Buyers News*, p. 2 (Jul. 3, 1990).

IPC Standard, Copper Foil for Printed Wiring Applications, (1981).

*Primary Examiner*—Benjamin L. Utech
*Assistant Examiner*—Donald L. Champagne
*Attorney, Agent, or Firm*—Curtis B. Brueske

[57] ABSTRACT

A method of forming circuit lines on a substrate by applying a roughened conductive metal layer using a copper foil carrier. The copper foil is etched away, leaving the roughened conductive metal embedded in the surface of the substrate. The conductive metal may be treated to remove an oxide layer. A photoresist may also be applied over the treated conductive metal layer to define a fine line circuit pattern. The photoresist defining the fine line circuit pattern is then removed to expose trenches in accordance with the desired circuit pattern. Copper is applied into the trenches over the exposed conductive metal, and the remaining photoresist, and conductive metal underlying the remaining photoresist, is removed to finish the fine line circuit pattern.

16 Claims, 10 Drawing Sheets

(Matte Side)

(Smooth Side)

(Matte Side)

(Matte Side)

METHOD FOR FORMING CONDUCTIVE TRACES AND PRINTED CIRCUITS MADE THEREBY

CROSS-REFERENCE TO RELATED APPLICATIONS

This application is a continuation-in-part of U.S. application Ser. No. 08/846,380, filed Apr. 30, 1997, now abandoned, which claims the benefit of U.S. Provisional Application No. 60/016,665, filed on May 1, 1996.

BACKGROUND OF THE INVENTION

This invention relates generally to methods for producing printed circuit boards and to a printed circuit board prepared by the method of this invention. In particular, it relates to a new method of forming fine circuit lines and to printed circuit boards having fine circuit lines.

In the typical production of printed circuit boards, copper foil is laminated to an insulating substrate, most often a glass reinforced epoxy resin prepreg. That laminate structure is further processed to convert the copper foil layer into a circuit pattern by selectively removing portions of the copper foil by chemical etching. FIGS. 1 and 2 illustrate cross-sections and the process steps, respectively, from a conventional pattern plating process for forming circuit lines on a printed circuit board.

Metallic foils are generally produced by an electrochemical process in a cell containing an anode, a cathode, an electrolyte solution containing metal ions, and a voltage source. When the voltage is applied between the anode and the cathode, the metal ions from the solution are deposited on the cathode to form the foil. The surface of the foil that is located, during formation, adjacent to the cathode may be referred to herein as the shiny side of the foil. The opposing side, which faces the anode and the electrolyte solution during formation of the foil, may be referred to herein as the matte side of the foil.

Thin copper foils have been applied to substrates from an aluminum supporting layer, with the aluminum being etched away to form a copper-clad substrate. A disadvantage of using aluminum as a supporting layer is that highly caustic etchants are required to etch away the aluminum. In addition, after etching the aluminum supporting layer, a desmutting step is required. It is desirable to avoid the desmutting step and the additional handling steps arising from the contamination of the etchant with dissolved aluminum.

As shown in FIG. 1, a protective resist layer is applied and cured prior to etching so that an etchant may be applied to the copper foil to create the desired circuit pattern. Ideally, the etchant would remove the unprotected copper foil in such a manner as to leave circuit lines with vertical sides.

A disadvantage of the process shown in FIGS. 1 and 2, however, is that the etchants actually do not create vertical sides of the circuit lines. Instead, the etchants tend to etch away too much copper at the top of the circuit line by undercutting the photoresist, leaving a somewhat trapezoidal-shaped circuit line. As a result, the minimum width of the circuit lines is limited by the need to allow for this non-uniform etching.

This problem was discussed in U.S. Pat. No. 5,437,914 (the "'914 patent") and it was shown that the shape of the etched circuit lines was affected by the shape of the grain structure of the copper foil. Improved accuracy of etching was to be obtained, according to the '914 patent, by treating the smooth or shiny side of the copper foil and then laminating the copper foil to the substrate with the smooth or "shiny" side down, which is contrary to the conventional practice. As shown in FIG. 1, the conventional practice involves laminating the copper foil to the substrate with the matte finish side of the copper foil being located adjacent to the substrate. An improved etching factor was obtained from the copper clad laminate of the '914 patent, indicating that the sides of the circuit lines were more nearly vertical.

Another approach to improving the accuracy of circuit lines is to use thinner copper foils, since they can be etched quickly with less undercutting. However, such foils are not easy to handle. Consequently, it has been proposed to deposit thin layers of copper on supporting sheets which can be removed after the foil has been laminated to a substrate. One example is found in U.S. Pat. No. 3,998,601 in which a 2–12 $\mu$m layer of copper is deposited on a conventionally thick copper foil (say 35–70 $\mu$m) and separated from the thicker foil by a release layer. After laminating the composite foil to a substrate, the supporting copper foil is mechanically stripped away, leaving the thin 2–12 $\mu$m foil ready for processing into an electronic circuit. One disadvantage of this approach is that such a procedure may result in removing portions of the thin foil when the supporting foil is stripped away.

Another known alternative for producing fine-line patterns is shown in U.S. Pat. No. 5,017,271 to Whewell et al. In accordance with the technique of Whewell et al., a layer of a first metal, such as chromium or nickel, is deposited on the untreated matte side of a copper foil to produce a composite. The composite is then laminated to a support layer, with the chromium layer being sandwiched between the copper foil and the support layer. Next, all of the copper foil is removed, and a photoresist is applied to the exposed chromium layer. The photoresist is then masked, irradiated and developed to expose the chromium layer according to the desired pattern. Copper is then deposited onto the exposed chromium layer and the remaining photoresist, and underlying chromium layer, are removed rendering a finished fine-line pattern. The contents of U.S. Pat. No. 5,017,271 are incorporated herein by reference.

As shown below in the comparative examples, a disadvantage of the techniques shown by Whewell et al. is that the chromium/copper composite may not adhere sufficiently to the support layer. It is desirable for the composite on the support layer to have a peel strength in excess of 6 lb/in. A further disadvantage of the technique shown by Whewell et al. is that the deposited copper layer may not adhere sufficiently to the exposed chromium layer. It is desirable for the deposited copper layer to adhere to the chromium layer and to otherwise resist peeling from the chromium layer.

It would therefore be desirable to have an improved method for forming conductive traces and printed circuits made thereby.

SUMMARY OF THE INVENTION

In accordance with a first aspect of the present invention, a printed circuit having fine circuit lines is provided. The printed circuit is formed by applying a roughened thin layer of a conductive metal, metals, or alloys to a nonconductive substrate. The conductive metal, metals, or alloys is preferably first applied to a sheet of treated copper foil and then the copper foil is applied to the substrate, with the thin conductive metal layer located between the copper and the substrate. During processing of the laminate, the copper foil is etched away, leaving the roughened thin layer of conductive metal in place on the substrate. Any existing oxide layer associated with the exposed conductive metal may be removed from the thin layer of conductive metal.

In accordance with a second aspect of the present invention, a method of forming fine circuit lines on a nonconductive substrate is provided. The method includes applying copper over a thin conductive layer in regions defined by a cured photoresist. The copper layer is preferably applied to the thin conductive layer after a conditioning step is applied to the thin conductive layer. The conditioning step may include removing an oxide layer from the thin conductive layer. The thin conductive layer may be applied to the substrate using a foil carrier. If the foil is treated to enhance its ability to bond to the substrate, the thin conductive layer may be applied to the foil either before or after such treatment.

A photoresist may then applied, imaged, and cured. The uncured resist may be removed, thereby defining an exposed region or "trench" on the surface of the substrate in which the circuit lines are to be formed. Since the conductive layer is now exposed, it is possible to selectively apply the circuit lines in those exposed regions. Finally, the cured photoresist may be removed and then the exposed conductive metal layer beneath the photoresist is removed by chemical etching, leaving the finished circuit.

It will be understood by those skilled in the art that the copper and conductive metals may be applied to the respective surfaces by any conventional method including, but not limited to, electroplating, electrolytic deposition, chemical vapor deposition, electroless deposition, sputtering, diffusion bonding or welding.

DETAILED DESCRIPTION OF THE PRESENTLY PREFERRED EMBODIMENT(S)

Figure 1:
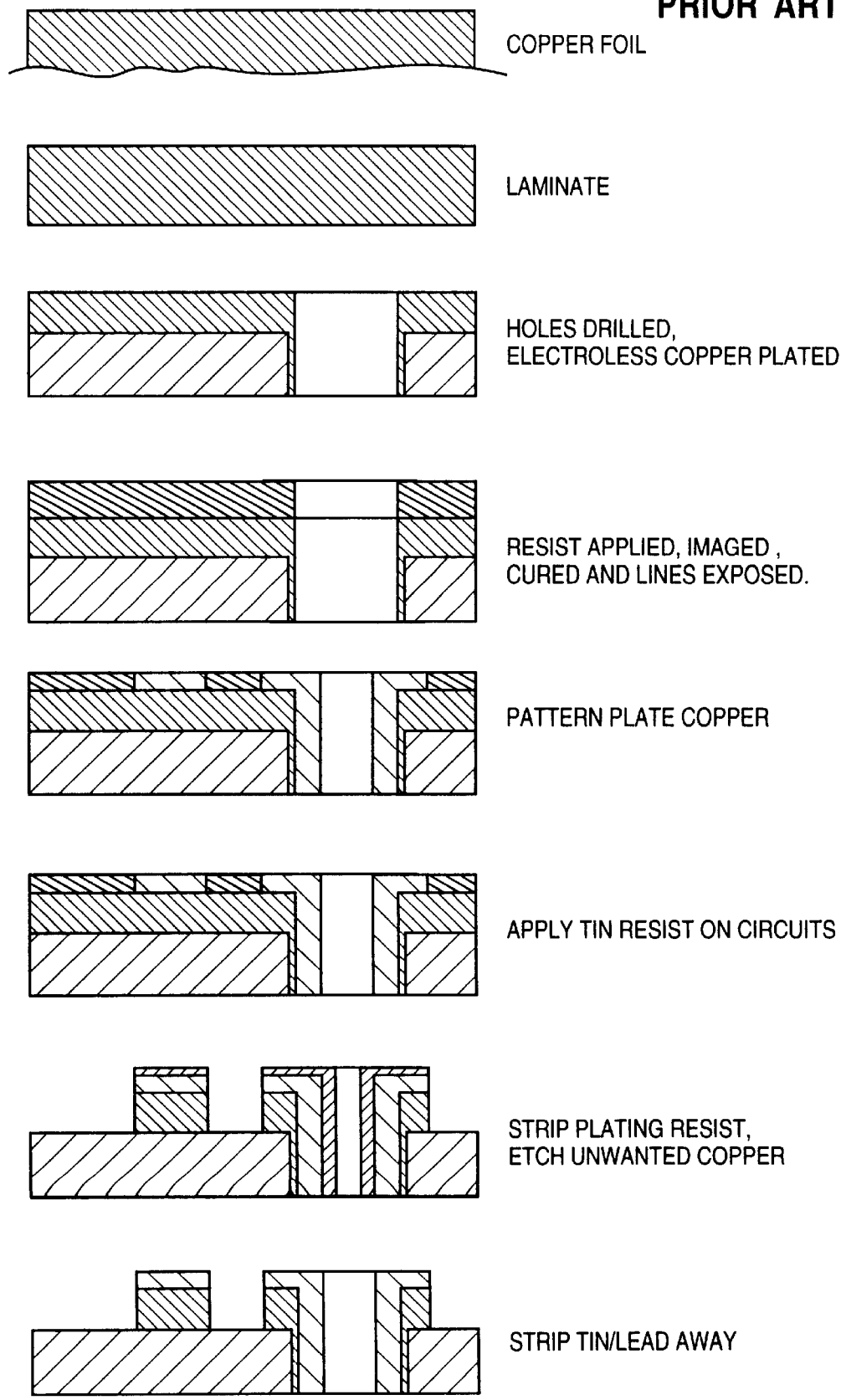
FIG. 1 shows cross-sections of a substrate at various steps of a conventional process for forming circuit lines on a printed circuit board.

Metals may be electrodeposited onto copper foil using known techniques. For example, in U.S. Pat. No. 5,437,914, the contents of which are incorporated herein by reference, a nodular deposit is formed on the shiny (i.e. smooth) side of a copper foil in order to roughen the foil and improve its adhesion when subsequently applied to an insulating substrate. Another approach is disclosed in U.S. Pat. No. 5,482,784, the contents of which are incorporated herein by reference, which shows a treatment that is applied to both sides of a copper foil. Generally, such treatments increase the surface area of the treated side(s) of the foil.

In addition, techniques are known for creating resistors on the surface of a printed circuit board. One technique starts with the electrodeposition of a layer of nickel-phosphorus on the surface of a copper foil, which is then laminated to an insulating substrate. Rather than acting as a typical conductive layer, the nickel-phosphorus layer is exposed by selective etching of the covering copper material where resistors are needed in the circuit design. The remaining copper layer is turned into the conductive circuit lines by conventional etching procedures. Such a technique is described in U.S. Pat. No. 4,808,967, which is incorporated herein by reference.

In accordance with a preferred embodiment of the present invention, an additive method is provided which contrasts from conventional circuit board processing in which the circuit lines are formed by selectively etching copper away. As explained above, chemical etching has inherent limitations that become particularly troublesome as circuit lines become narrower and their pitch smaller, i.e. in the formation of fine circuit lines. In contrast, the method of a preferred embodiment deposits the circuit lines directly into predefined spaces created by the use of an etchant and a photoresist, which leaves open trenches that may be filled by electrodeposition of copper.

Although it is preferred that the circuit traces be formed from copper, other metals, such as gold, may alternatively be used. Because the traces are formed by selectively adding, for example, copper into the predefined spaces, this preferred embodiment is referred to herein as an "additive" process. The method described herein may be used with either panel plating or pattern plating techniques.

Typically, electrodeposited copper does not adhere well to substrate materials. However, another preferred embodiment makes advantageous use of a thin conductive layer that remains on the surface of the substrate once a covering copper foil carrier has been removed. In particular, the thin conductive layer is used as a foundation for electrodepositing fine circuit lines on the substrate in a pattern defined by photoresist. Preferably, the adhesion of the electrodeposited copper to the thin conductive layer is improved by applying a conditioning treatment, as described in greater detail below, to the thin conductive layer before electrodepositing copper onto the exposed portions of the thin conductive layer. In addition, it is preferable that the thin conductive layer is formed with a treated surface, as described below, to improve the ability of materials to adhere to it.

Figure 3:
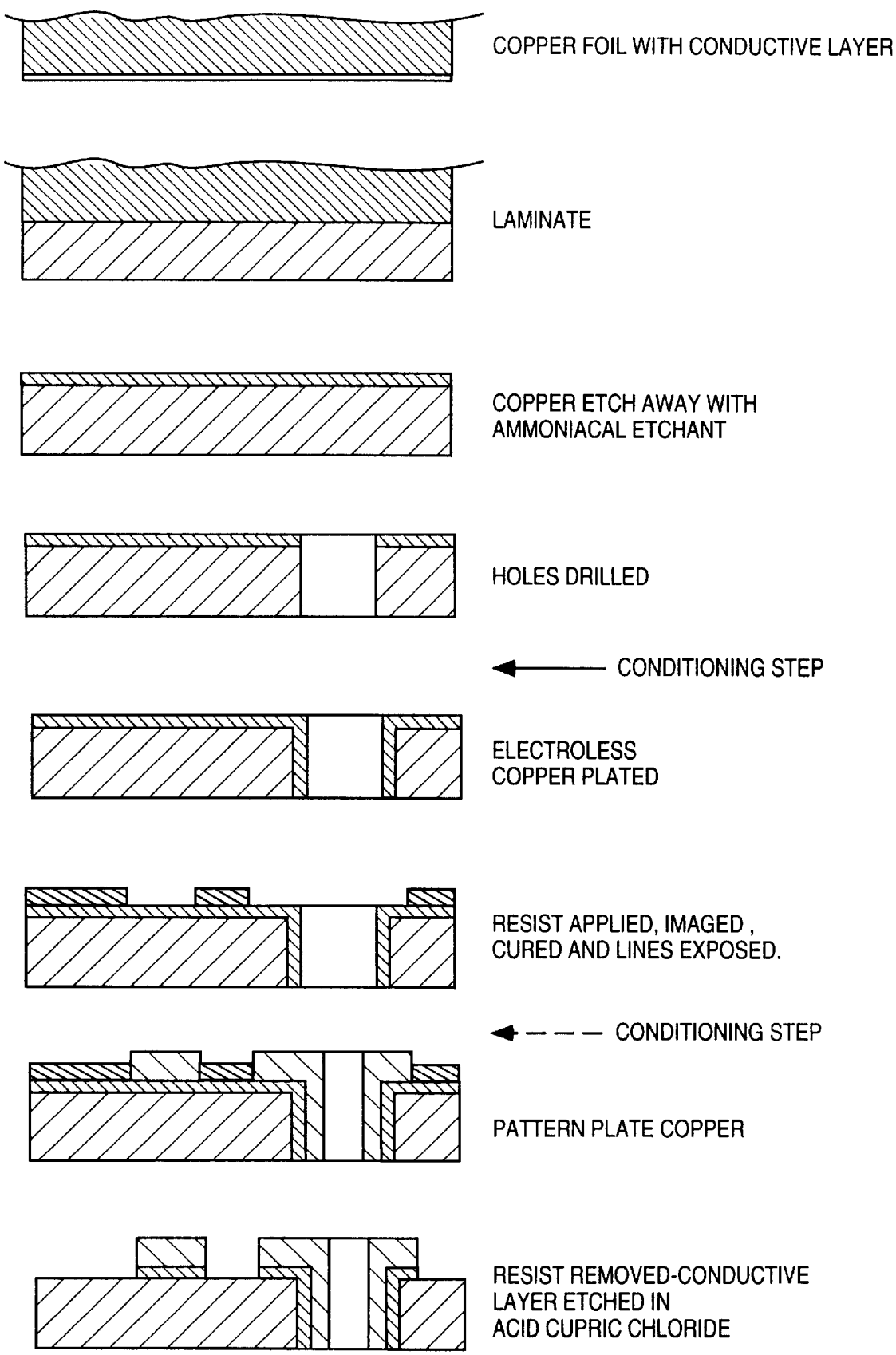
FIG. 3 shows cross-sections of the substrate at various steps in a process in accordance with a preferred embodiment of the present invention.
Figure 4:
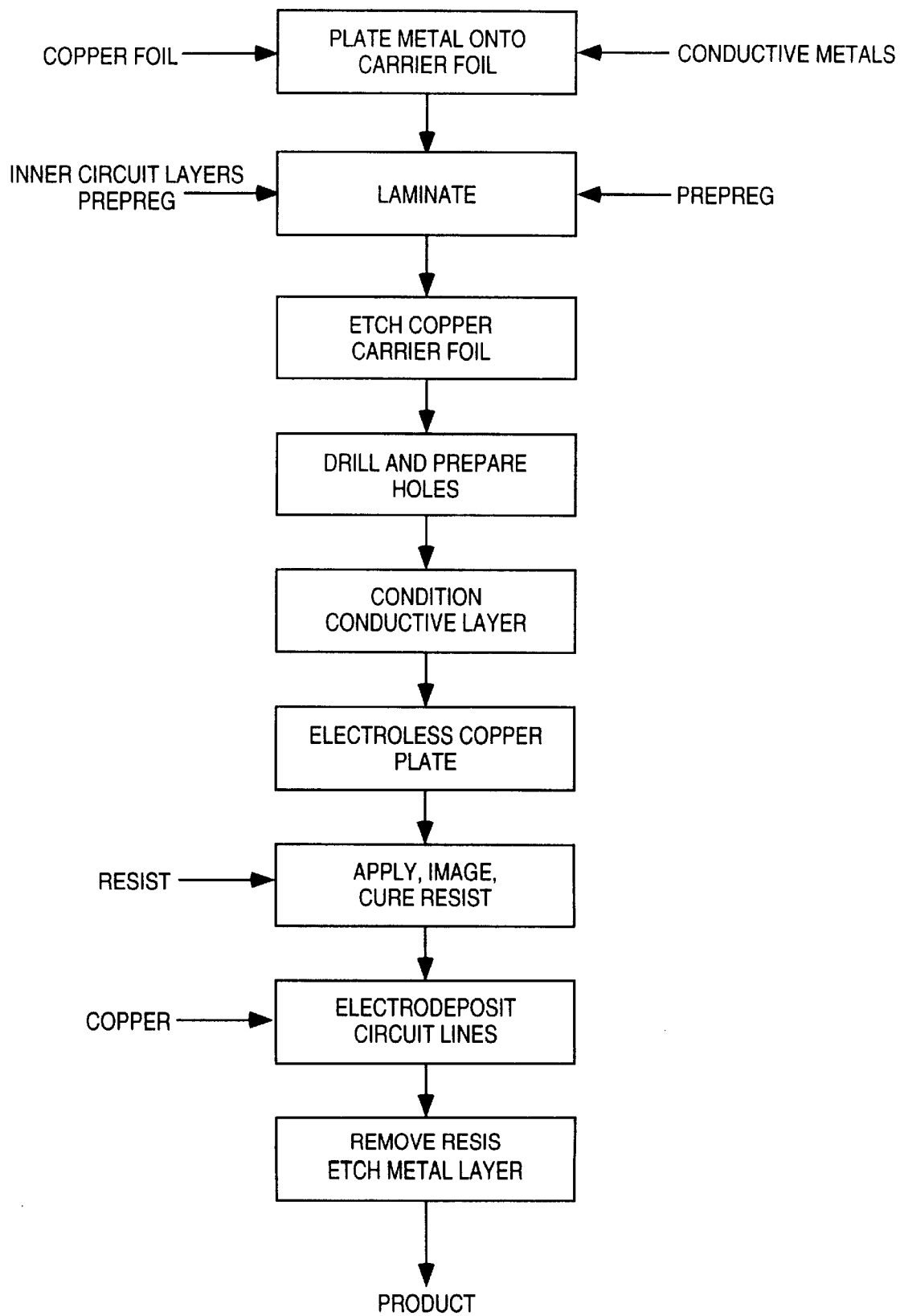
FIG. 4 is a process flow diagram in accordance with a preferred embodiment of the invention.

The steps of a preferred embodiment are shown in FIGS. 3 and 4, which illustrate the cross-sections of a laminate and process steps during the process of a preferred embodiment, as applied to the outer layers of a printed circuit board. The method is particularly advantageous when used to make the outer circuit layers of multilayer circuit boards, but also may be used for inner layers, including buried vias, micro vias and the like, or one- and two-sided circuit boards. For these alternative applications, the same process may be used.

In the first step, copper foil is passed through a bath of soluble compounds of a conductive metal, metals or alloys (referred to herein interchangeably as "conductive metal") and the conductive metal is electrodeposited, to a thickness of about 0.05 to 5 µm on one surface of the foil. The conditions of the electrodeposition process are typical of those used commercially for electroforming and electroplating.

The conductive metal may be deposited on either the matte or shiny side of the foil. However, in accordance with one preferred embodiment, the conductive metal is deposited on the shiny side of the foil before or after the shiny side is treated to improve its ability to adhere to a substrate. Such a treatment is described in greater detail below. In accordance with a further preferred embodiment, a subset of the 0.05 to 5 µm range is utilized. Specifically, an electrodeposition layer thickness in the range of 0.1 to 1 µm is preferred for the fine circuit line application described herein.

As noted above, either before or after application of the thin conductive metal, the copper foil may be given a treatment to improve its adhesion to the insulating substrate. The preferred treatment is a nodular deposit formed on either the shiny side or the matte side of a raw foil. A preferred process, in which the shiny side of a copper foil is treated with nodular deposits before application of the thin conductive metal, is described below. The thin conductive metal may be tin, nickel, tin-zinc, zinc-nickel, tin-copper and others, provided that it is resistant to the etchant used to remove copper during a subsequent step. A preferred conductive metal is nickel. In addition, the nodules formed on the raw foil preferably have a size of less than approximately 3 microns. One advantage of the preferred process is that the surface finish of the treated side of the copper foil is imparted to the thin conductive metal.

In the next step the copper foil carrier with the thin conductive metal coating is laminated to an insulating substrate, such as the commonly used glass reinforced epoxy resins, using conventional techniques. The thin conductive metal layer is located adjacent to the substrate. Conventional techniques for forming laminates using a conductive metallic foil and a substrate are shown, for example, in U.S. Pat. Nos. 5,017,271 and 3,998,601, the contents of which are incorporated herein by reference.

The next step is to etch away the copper foil, leaving the thin layer of conductive metal embedded in the surface of the substrate. For this purpose, the etchant is selected from those etchants that will remove copper, but not the metal, metals or alloy of the thin conductive layer to a significant extent. Examples of such etchants, for the case where the conductive metal layer is nickel, include the ammoniacal or alkaline etchants.

After etching the copper, a conductive laminate of the thin conductive layer and the substrate remains. If the copper foil received a nodular treatment before the thin conductive metal was applied to the copper foil, then the surface finish of the thin conductive metal on the laminate generally matches the surface finish of the treated copper foil. It is to be noted that, because of the treatment applied to the foil, the thin conductive metal on the laminate exhibits an inverse nodular treatment.

It is an advantage of the preferred embodiment that the etched copper is recoverable and that contamination with dissolved aluminum is avoided, which would occur if aluminum were to be substituted for copper in the above process. In particular, the copper foil may be etched without using the highly caustic etchants that aluminum may require. In addition, the subsequent desmutting step that would be required after etching away an aluminum supporting layer is entirely avoided.

Once the copper carrier is etched away, holes may be drilled through the thin conductive metal layer and the substrate. Because drilling gives rise to debris and possible resin smear, the conductive laminate is cleaned after the holes are drilled. Cleaning typically involves desmearing, which includes immersion in a permanganate solution followed by rinsing.

After the copper foil is etched away with an ammoniacal or alkaline etchant and the holes are drilled, a conditioning step is preferably applied, although as discussed below, the conditioning step may be performed after a resist layer is applied, imaged and cured. If the thin conductive layer is nickel, for example, and it is exposed to air, an oxide film may form on the thin conductive layer. In addition, the cleaning process applied to the conductive laminate after the holes are drilled may cause further oxidation. This oxide buildup may negatively effect the adhesion of a subsequently applied conductive trace. By conditioning the nickel surface, the oxide layer is removed thereby improving the ability of the copper to bond with the nickel layer.

The preferred conditioning step is a cathodization process, which may proceed as follows. After rinsing the clad substrate and cured resist in deionized water, the negative terminal of a rectifier is connected to the thin conductive layer. The thin conductive layer thus becomes the cathode in this cathodization step. The positive terminal of the rectifier is connected to a dimensionally stable anode in a bath with 10% sulfuric acid solution. A dimensionally stable anode is one that is formed of any material that does not dissolve in the solution.

Rather than a 10% sulfuric acid solution, the solution may alternatively be any salt solution that is capable of carrying current, but not depositing a metal. An anode-cathode gap of approximately two inches may be used.

During the cathodization step, hydrogen evolves at the cathode and removes the oxide layer on the surface of the thin conductive layer. While timing may vary depending upon the amount of oxide buildup, the substrate and thin conductive layer may be cathodized for 10 seconds at 40 amps/square foot ("asf").

Alternative conditioning steps may be used. For example, the exposed thin conductive layer may be bathed or rinsed in concentrated hydrochloric acid to remove the oxide from the surface of the thin conductive layer.

After cathodization, the holes, if any, may be activated by plating, with copper for example, using an electroless plating technique. Preferably, the electroless copper deposition occurs soon after the cathodization step in order to avoid the recurrence of the oxide layer on the thin conductive layer.

Figure 5A:
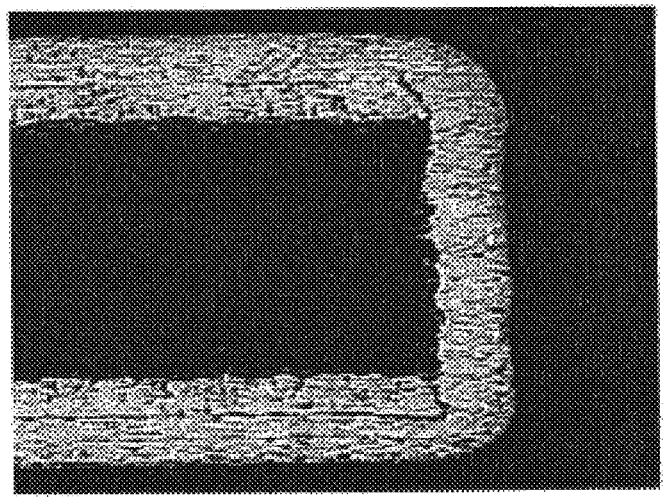
FIGS. 5A and 5B show a plated through hole formed with conventional copper foil and with a preferred embodiment of the present invention, respectively.

FIG. 5A shows a plated through hole formed with conventional copper foil. A plated copper layer is formed on top of the copper foil, and extends through the hole in the substrate material.

Figure 5B:
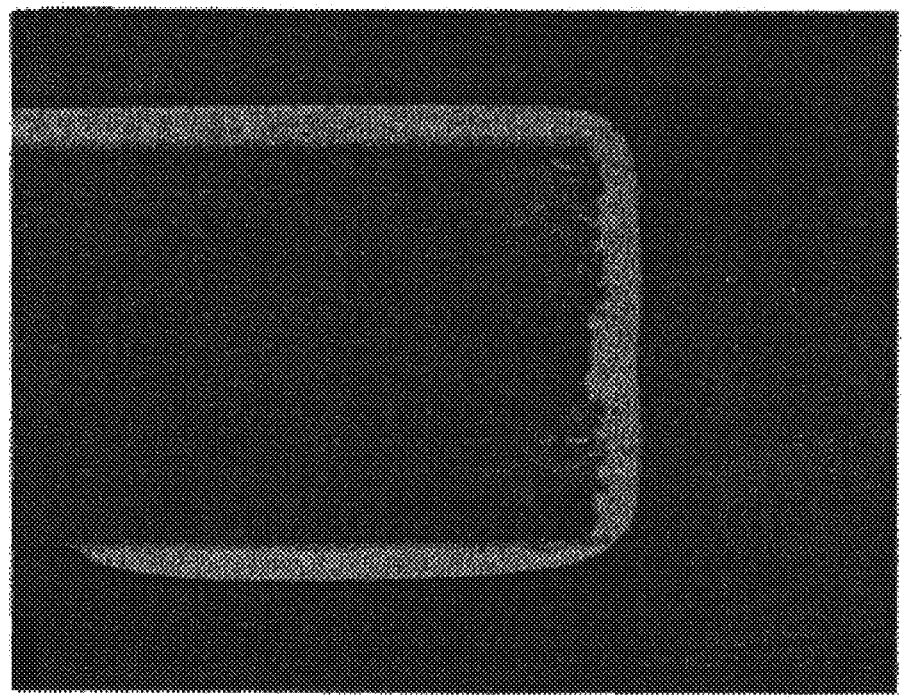

In comparison, FIG. 5B shows a plated through hole formed in accordance with a preferred embodiment of the present invention. The thin conductive metal layer, in this case formed from nickel, lies adjacent to the substrate. The hole was first plated with electroless copper and then an electrodeposited copper layer, as shown in the process of FIGS. 3 and 4. While the plated through hole shown in FIG. 5A has a thicker buildup of copper on its top and bottom sides than is present within the through hole, the substrate and plated through hole shown in FIG. 5B has a more uniform copper thickness.

Referring again to FIGS. 3 and 4, a resist layer is then applied, imaged and cured in accordance with the desired pattern for the fine circuit lines. In particular, an uncured portion of the resist is removed, thereby defining exposed regions or "trenches" on the surface of the substrate. The sides of the trenches are formed by the cured resist and the bottom of the trenches are the thin conductive metal layer (and electroless copper if there are holes in the substrate). These trenches will form and shape subsequently deposited copper into fine circuit lines. The resist material may be a liquid or film photoresist.

Once the copper foil has been etched away, the oxide layer removed, the electroless copper applied and the resist applied, cured and selectivity removed, the thin conductive metal layer is exposed and ready for application of a pattern plated copper. The plated copper is preferably electrodeposited using conventional procedures such as are often used to plate copper onto the outside of multilayer circuit boards. For example, the laminate with the photoresist trenches may be plated in copper sulfate for one hour at 25 asf. It is possible to do this when the thin layer of metals embedded in the surface of the substrate is sufficiently conductive. The copper can be built up in thickness as desired, up to the height of the photoresist that defines the shape of the trenches. Conventional electrodeposition conditions may be used. If using very thin copper circuit lines, plating may begin at a lower current density and then ramp up as the copper layer builds.

It will be evident to those skilled in the art upon reading this detailed description, that cured photoresist will more accurately define the circuit lines and that the copper which fills the trenches will more closely approach the ideal rectangular shape than would circuit lines formed by etching away copper in exposed areas. This means that finer circuit lines can be made because their shape is not determined by an etching process. Consequently, rather than 4 mil (100 $\mu$m) lines and spaces, the process described herein permits reducing the lines and spaces to about 1 mil (25 $\mu$m).

At this point, the circuit lines have been formed. What remains is to remove the remaining resist by conventional means, and then to remove the thin conductive metal layer, which is exposed by removing the cured photoresist, using an etchant. Acid chloride or sulfuric peroxide may be used to remove the thin conductive metal layer and electroless copper layer. A preferred etchant is acid cupric chloride FIG. 3 shows cross-sections of the substrate at various steps in the process of FIG. 4. As described above and shown in FIG. 3, the conditioning step may either precede or follow the application, imaging and curing of the resist.

It is to be noted that the specific steps of the invention (e.g. those illustrated in FIGS. 3 and 4) may be performed in any order that is commercially practicable. In particular, the steps subsequent to applying the conductive metal to the laminate may be performed in whatever order is feasible for the operator. For example, the conditioning step may be applied after, rather than prior to, the application imaging and curing of the resist. In addition, although described above with regard to a pattern plating technique, the preferred embodiment may also be used in conjunction with a panel plating process.

Although generally applicable to the fabrication of conductive laminates, the preferred embodiments have particular value in making the outer layers of multilayer circuit boards. Multilayer circuit boards generally have holes connecting outer layers with inner layers. The outer layer circuit lines are preferably formed by electroplating.

Figure 2:
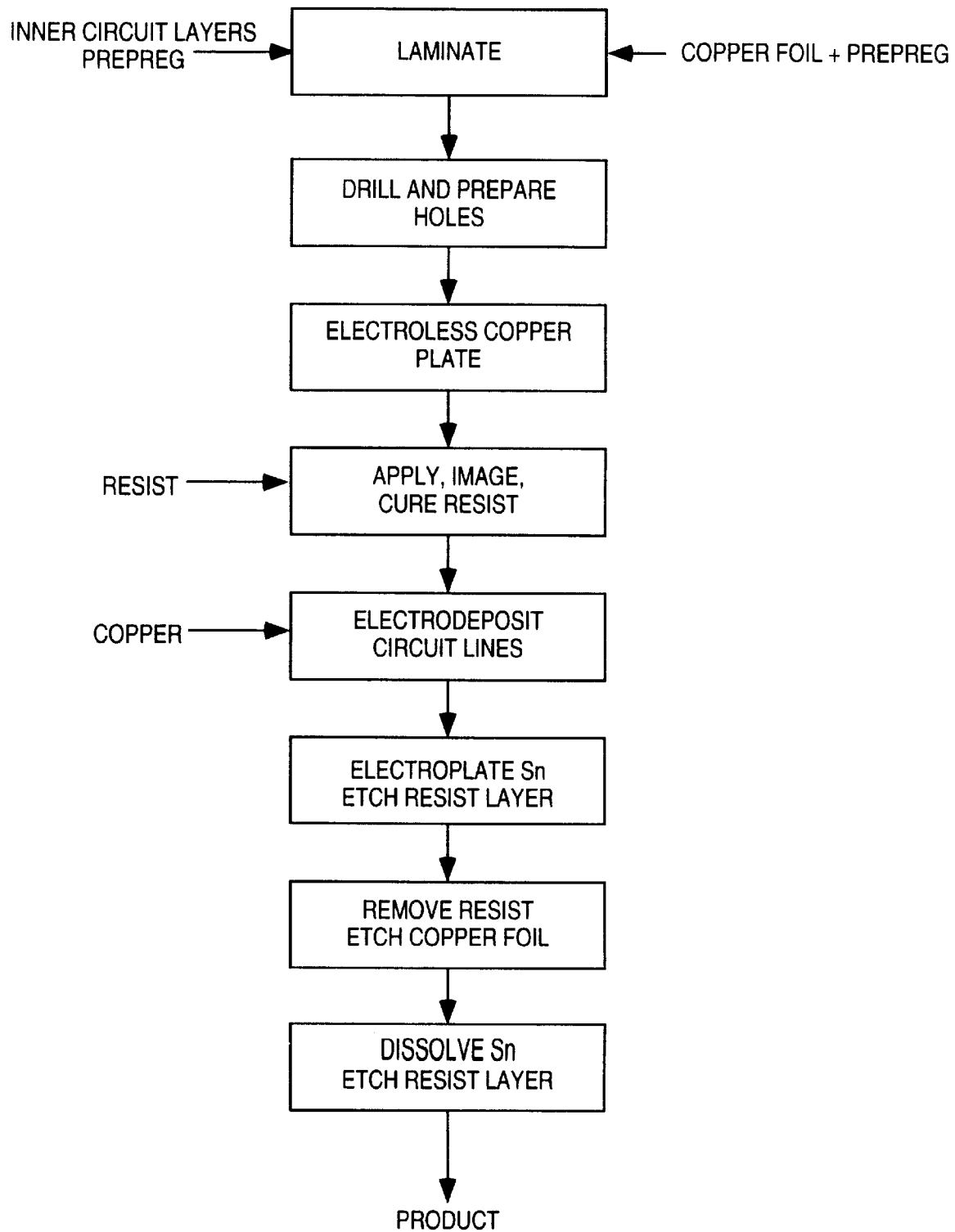
FIG. 2 is a process flow diagram for the conventional process shown in FIG. 1.

The conventional procedure is shown in the process flow diagram of FIG. 2 and the cross-sections in FIG. 1. Copper foil is laminated with an intervening layer of prepreg to the inner circuit layers, but is not etched away. Electroless plating is used to deposit copper over the foil and in the holes which connect the layers. Then, a resist is applied and the copper circuit lines are electrodeposited. At this point, the excess copper foil must be removed by etching. However, the circuit lines and the plated holes must be protected by a step of electrodepositing a resistant metal, such as tin. Then the resist can be removed and the exposed copper foil etched. It can be appreciated that such a step causes the sides of the circuit lines not protected by the tin to be attacked also. In contrast, in the present embodiments, tin need not be applied since it is only necessary to remove the thin conductive layer, which can be accomplished very quickly. Importantly, the substantial costs of disposing of solutions needed for applying and removing the tin layer are avoided.

Figure 6B:
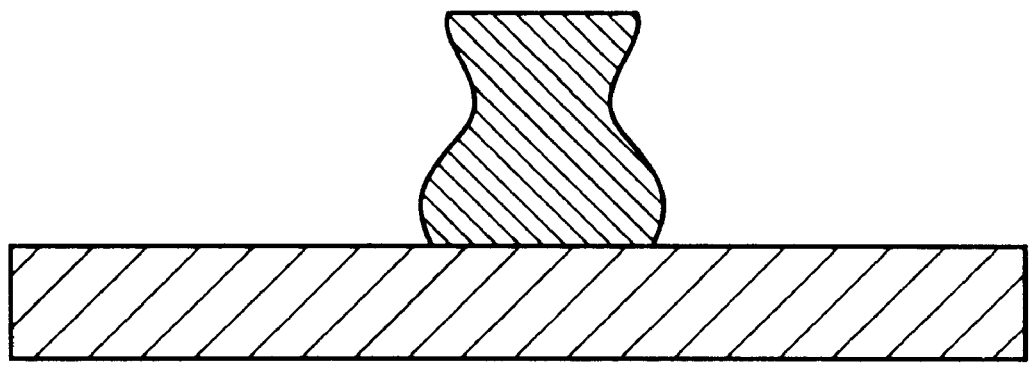
FIGS. 6A and 6B shows a cross-sectional illustration of conventional circuit lines compared with those of the preferred embodiment, respectively.
Figure 6A:
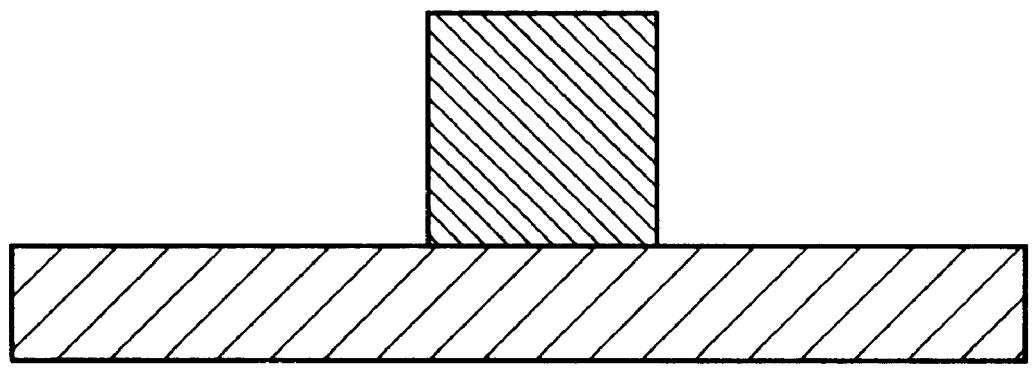

FIG. 6A shows a cross-sectional illustration of the circuit lines formed in the outer layers of multilayer circuit boards by conventional etching processes, compared to FIG. 6B, which shows an essentially rectangular line formed using the process of the invention. The circuit lines of the prior art are severely undercut by the need to etch away copper foil after the circuit lines are formed (the top being protected by the tin coating).

The process of the invention makes possible more accurate production of circuit lines and, thus, the circuit designer does not have to compensate for the inaccuracy inherent in the formation of circuit lines by etching. This means the resulting circuit can be smaller and more compact. The process uses techniques which are familiar to circuit board manufacturers. In fact, it is expected that the production processes will be simplified when the process of the invention is adopted.

As noted above, a further advantage of the preferred embodiments is improved adhesion. According to one general industry specification, the minimum peel strength for ½ oz. copper foil should be 6.0 lbs/in at room temperature. Military standard MIL-S-13949/4D specifies, for foils with low profile (<400 $\mu$m), a minimum peel strength of 4 lbs/in after thermal stress, elevated temperature and exposure to process solutions.

EXAMPLES

Samples of a copper foil formed in accordance with the preferred embodiments met and exceeded these requirements. The samples were made as follows. A first sample was formed by applying a bonding treatment to the shiny side of a thin copper foil. The bonding treatment produced nodular deposits on the shiny side of the foil. Nickel was then deposited on the treated, shiny side of the copper foil. The roughness, in terms of the maximum peak-to-valley distance, of the shiny side of the foil, after the bonding treatment, was approximately 70 to 200 microinches. On a second sample, nickel was deposited on the matte side of a copper foil, which had been treated to produce a nodular deposit on the matte side. The roughness of the matte side of the foil, after the bonding treatment, was approximately less than 350 microinches. An attempt was made to apply the techniques of U.S. Pat. No. 5,017,271 by forming a third sample by depositing nickel on the untreated matte side of a copper foil. The thickness of the nickel deposited on all three samples was 0.5 $\mu$m. The foils were then laminated to prepeg substrates, with the nickel surfaces being located adjacent to the substrates.

Tables 1 and 2 below provide the plating bath and run conditions for samples 1 and 2, respectively. In tank 1, the copper plating tank, nodular deposits were formed on the copper foil. In a second tank, nickel was deposited onto the treated copper foil. The nickel plating solution included 375 g/l of $Ni(SO_3NH_2)_2$, 8 g/l of $NiCl_2 6H_2O$, and 35 g/l of $H_3BO_3$. The pH of the nickel plating solution was adjusted to 4 using $H_2NSO_3H$.

TABLE 1

| Example #1 - Shiny side Treated | | Temp (F.) | pH | Current Density (ASF) | Time |
|---|---|---|---|---|---|
| | Cu (g/l) | Acid (g/l) | | | |
| Copper Plating Tank 1 | 13.5 | 119 | 80 | 185 | 10 sec |
| | Ni (g/l) | Cl (g/l) | | | |
| Nickel Plating Tank 2 | 88 | 7.0 | 130 | 4 | 110 | 11 sec |
| | Cr (g/l) | | | | |
| Chromate Dip | 0.5 | | 85 | 12.5 | 20 | 4 sec |

TABLE 2

| Example #2 - Matte side Treated | | Temp (F.) | pH | Current Density (ASF) | Time |
|---|---|---|---|---|---|
| | Cu (g/l) | Acid (g/l) | | | |
| Copper Plating Tank 1 | 13.5 | 119 | 80 | 165 | 10 sec |
| | Ni (g/l) | Cl (g/l) | | | |
| Nickel Plating Tank 2 | 88 | 7.0 | 130 | 4 | 110 | 11 sec |
| | Cr (g/l) | | | | |
| Chromate Dip | 0.5 | | 85 | 12.5 | 20 | 4 sec |

The third sample was passed through the nickel plating tank and chromate dip, under the same conditions as Tables 1 and 2, but did not pass through the copper plating tank.

Several tests were performed on the samples. These tests included condition A peels, condition B peels, boiling, elevated temperature and replated adhesion. Condition A peel strength is the measured peel strength at room temperature. Condition B peel strength is the measured peel strength after floating on solder at 550° F. for ten seconds. Boiling peel strength was measured after boiling peel strips in water for two hours. Elevated temperature peel strength was measured after immersing a sample in hot oil at 125° C. The results were as follows:

TABLE 3

| | Peel Strength | | | |
|---|---|---|---|---|
| | Cond A lb/in | Cond B lb/in | Boil lb/in | Elevated temp lb/in |
| Sample #1 | 6.5 | 6.3 | 6.2 | N/A |
| Sample #2 | 7.6 | 7.3 | 7.3 | 6.0 |
| Sample #3 | 3.2 | 3.5 | 3.8 | 3.7 |

The samples were also tested after being replated. Replating refers to the electrodeposition of copper onto the laminate from a salt solution after the copper foil has been removed from the conductive layer. Samples 1 and 2 were conditioned prior to replating by cathodization as described above. In the case of sample #3, the conductive surface was not conditioned prior to replating. For all three samples, the concentration of the copper solution for replating was: 48 g/l of copper and 62 g/l of acid. The solution temperature was 120° F. and the current density/time was 25 asf for 1 hour. The replating step is intended to simulate the buildup of circuitry on the etched laminate. Replated adhesion was measured by etching away the copper foil on the three samples and, after cathodizing the nickel in samples 1 and 2, replating the surface of the nickel with copper to simulate the build up of circuitry.

TABLE 4

| | Replated Adhesion | | |
|---|---|---|---|
| | Cond A lb/in | Cond B lb/in | Boil lb/in |
| Sample #1 | 6.4 | N/A | N/A |
| Sample #2 | 10.4 | 10.3 | 9.1 |
| Sample #3 | 0.0 | 0.0 | 0.0 |

As shown above, samples 1 and 2 exhibited superior performance in peel strength and replated adhesion, in comparison to known foils. Samples 1 and 2 also exhibited superior performance in heat age testing, where the sample was heated in an oven at 350° F. over a number of days.

Figure 7A:
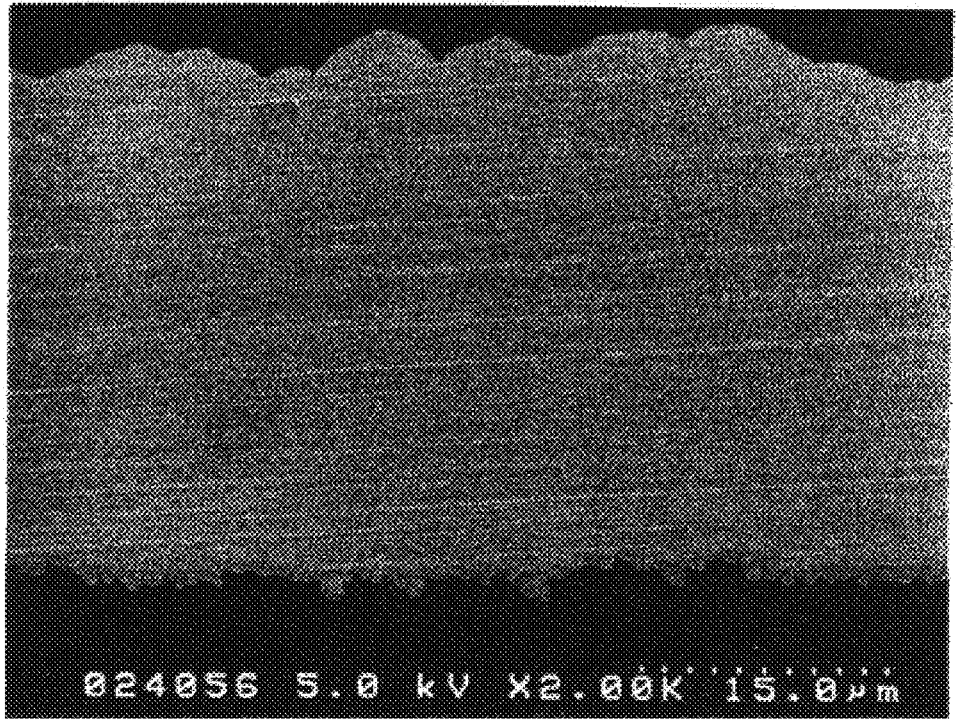
FIGS. 7A and 7B are cross-sections of a first sample foil and laminate, respectively, made in accordance with a preferred embodiment of the present invention.

FIG. 7A is a cross-section of the treated foil used to make sample 1. In FIG. 7A the matte side is oriented toward the top of the figure and the shiny side, with the nodular treatment, is oriented toward the bottom of the figure. A thin conductive layer of nickel is located on the shiny side of the foil.

Figure 7B:
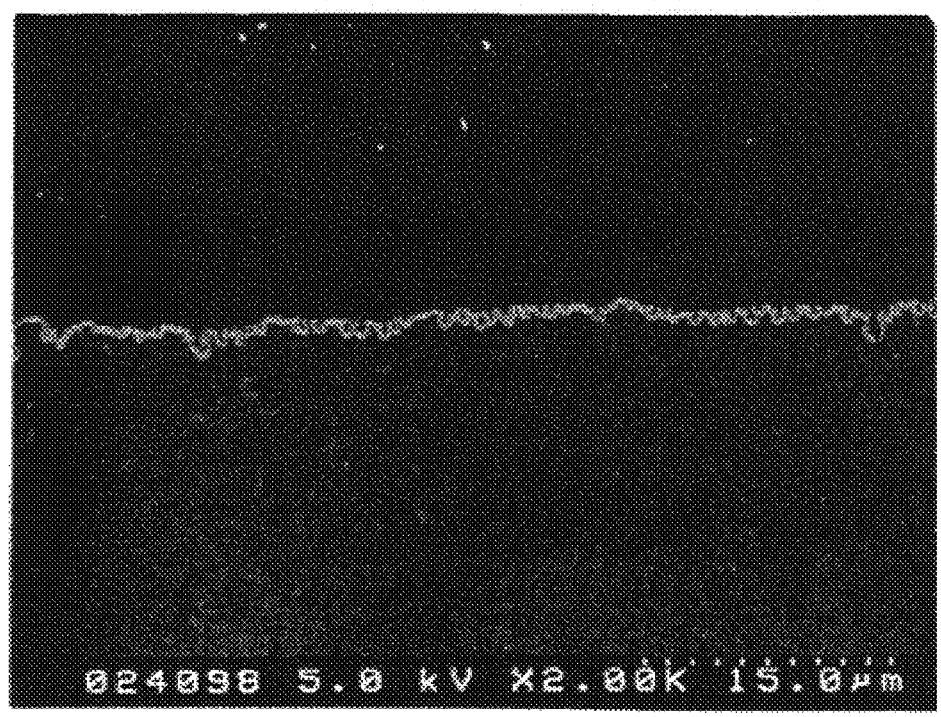

FIG. 7B is a cross-section of a conductive laminate made using the foil shown in FIG. 7A. In FIG. 7B, the copper foil has been etched away to expose the nickel layer on the surface of the laminate. It is notable that the surface finish of the nickel layer shown in FIG. 7B generally matches the surface finish of the shiny side of the foil shown in FIG. 7A.

Figure 8A:
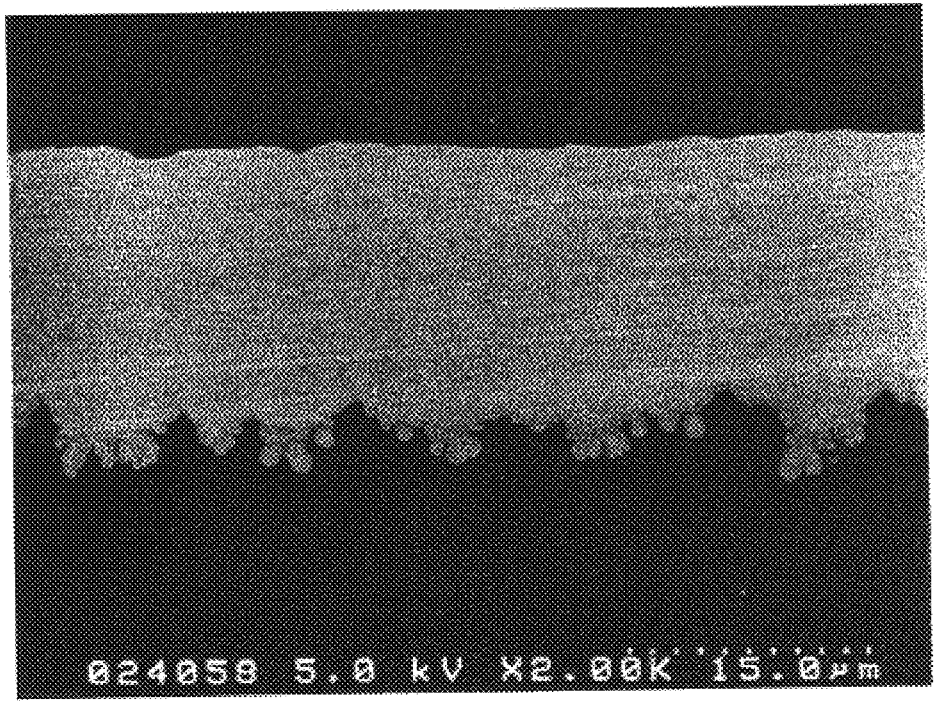
FIGS. 8A and 8B are cross-sections of a second sample foil and laminate, respectively, made in accordance with another embodiment of the present invention.
Figure 8B:
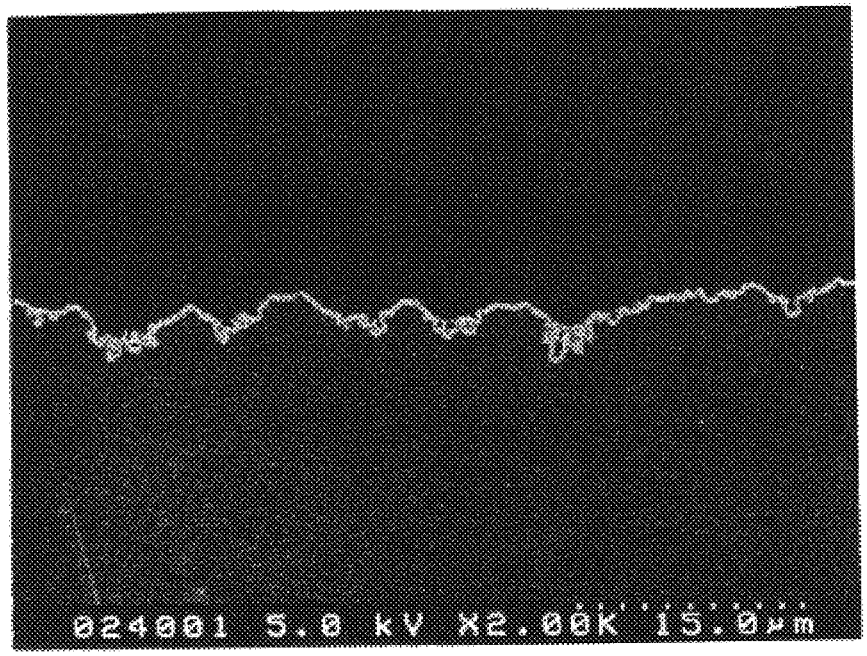

FIGS. 8A and 8B are cross-sections of the treated foil and conductive laminate, respectively, used to make sample 2. As noted above, sample 2 was formed with the matte side of the foil being treated and located adjacent to the substrate.

Figure 9A:
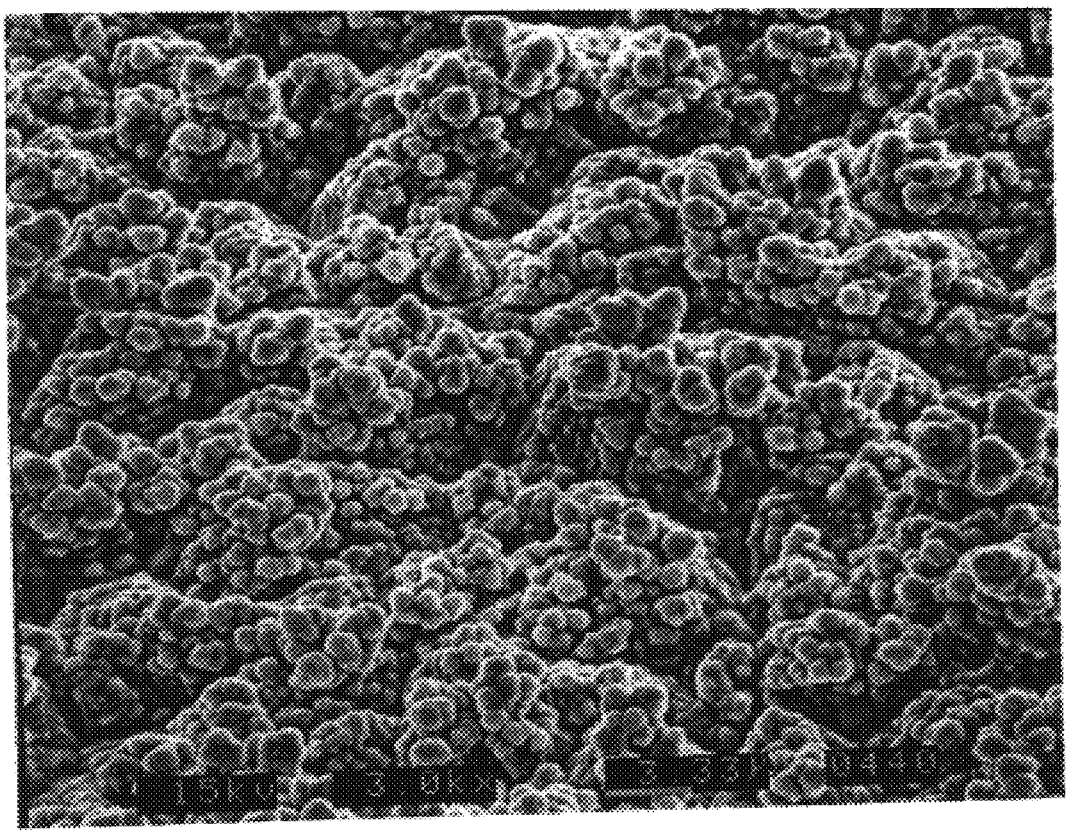
FIG. 9A is a SEM photograph of a matte side of the foil shown in FIG. 8A.
Figure 9B:
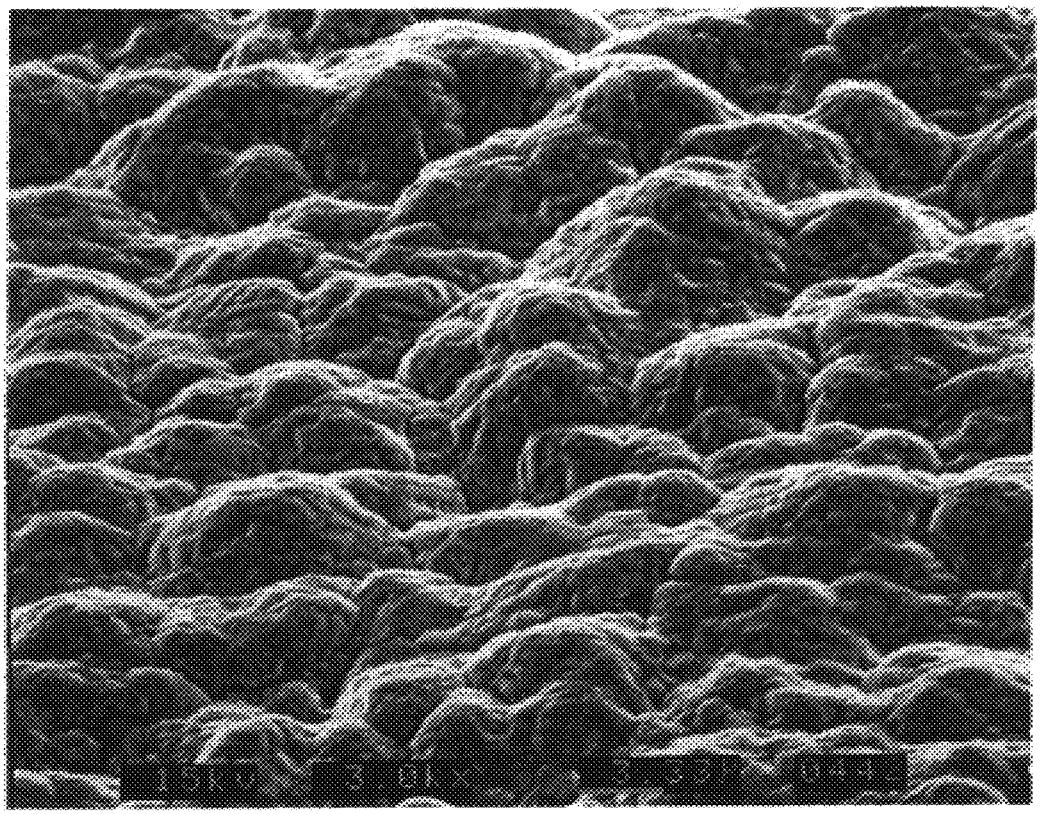
FIG. 9B is a SEM photograph of a matte side of a foil made in accordance with a known technique.

FIG. 9A is a SEM photograph of the matte side of the treated foil, including the thin conductive metal layer, that was used to make sample 2 and is shown in cross-section in FIG. 7B. In comparison, FIG. 9B is a SEM photograph of the matte side of the untreated foil, including the thin conductive metal layer, that was used to make sample 3. In FIGS. 9A and 9B, the thin conductive metal layer, which in the samples was formed from nickel, has been applied to the matte side of the foils. The increased surface area of the foil in FIG. 9A is apparent.

As illustrated by the above results, both sample 1 and sample 2 were superior to sample 3 in terms of peel strength and replated adhesion. Sample 3 exhibited poor peel strength and negligible replated adhesion. Furthermore, both sample 1 and sample 2 met and exceeded the industry specifications for peel strength and replated adhesion, whereas sample 3 failed to meet the industry specifications. It is believed that these failures will be magnified when used with advanced substrate materials which inherently have lower peel strength as compared to the industry standard epoxy.

For fine line printed circuit applications, sample 1 is preferred to sample 2. Specifically it is believed that due, at least in part, to the excessive roughness of its surface, sample 2 exhibited a potential to retain foil material within pits formed on the surface of the conductive laminate. It was difficult to completely etch the copper layer out of the pits formed in the nickel layer by the nodular treatment. A comparison of FIG. 7B to FIG. 8B shows that the pits in the nickel layer of sample 1, shown in FIG. 7B, were smaller and more open to the surface than the pits in the nickel layer of sample 2, shown in FIG. 8B. It is believed that this difference was due at least in part to the more moderate roughness of the surface of sample 1. The incomplete etching of the copper layer is problematic because it may cause shorting of fine circuit lines.

The foregoing detailed description is intended to be illustrative rather than limiting, and the scope of the invention is to be measured by the following claims, including any equivalents thereto.

We claim:

1. A method of preparing a conductive laminate, comprising the steps of;

treating a copper foil having a shiny side and a matte side to increase a surface area on a side of the copper foil;

forming a thin conductive metal layer on the treated side of the copper foil wherein the thin conductive metal layer is fabricated from a metal other than copper;

lamininating the copper foil having the thin conductive metal layer to a substrate, wherein the thin conductive metal layer is disposed between the copper foil and the substrate; and removing the copper foil front the laminate, thereby producing the conductive laminate.

2. A method as claimed in claim 1, wherein the conductive metal layer of the conductive laminate has a surface finish that matches the treated side of the copper foil.

3. A method as claimed in claim 2, wherein the surface finish of the conductive metal layer is characterized by a roughness of less than 350 $\mu$ in.

4. A method as claimed in claim 1, wherein the treated side of the copper foil is a shiny side of the copper foil.

5. A method as claimed in claim 4, wherein the treating step comprises roughening the copper foil.

6. A method as claimed in claim 1, wherein the treating step comprises depositing copper nodules on the side of the copper foil.

7. A method as claimed in claim 6, wherein the nodules have an approximate size of less than 3 microns.

8. A method as claimed in claim 1, further comprising the steps of:

applying and imaging a photoresist layer on the thin conductive metal layer;

curing a portion of a photoresist, thereby forming a corresponding uncured portion of the photoresist;

removing the uncured portion of the photoresist to form trenches having exposed conductive metal; and applying copper onto the exposed conductive metal layer to produce circuit lines.

9. A method as claimed in claim 8, further comprising, before the step of applying copper onto the exposed conductive metal layer, the step of conditioning the laminate to remove an oxide layer from the exposed conductive metal layer.

10. A method as claimed in claim 9, wherein the conditioning step comprises the step of cathodizing the conductive metal layer.

11. A method as claimed in claim 1, further comprising the step of electrodepositing a layer of copper onto the conductive metal layer.

12. A method as claimed in claim 11, wherein the electrodepositing step comprises depositing the layer of copper on defined regions of the conductive metal layer.

13. A method of forming circuit lines on a substrate comprising the steps of:

(a) applying, to a sheet of foil, a layer of conductive metal;

(b) laminating the conductive metal containing sheet of foil to the substrate;

(c) etching away the foil from the laminate produced in (b), leaving the conductive metal embedded in a surface of said substrate;

(d) conditioning the laminate to remove an oxide layer from the exposed conductive metal;

(e) applying, imaging, and curing a portion of a photoresist over the laminate, thereby forming an uncured portion of the photoresist;

(f) removing the uncured portion of the photoresist of (e) leaving trenches having exposed conductive metal; and (g) applying a second metal onto the exposed conductive metal of (f) to produce circuit lines.

14. A method as claimed in claim 13, further comprising the step of removing the cured photoresist of (e) to expose the conductive metal and etching away the exposed conductive metal, thereby producing a circuit on said substrate.

15. A method as claimed in claim 13, wherein said conditioning step comprises applying a cathodization process to the exposed conductive metal.

16. A method as claimed in claim 15, wherein said cathodization process comprises the steps of:

connecting a negative terminal of a rectifier to the conductive metal;

connecting a positive terminal of the rectifier to a dimensionally stable anode; and immersing the substrate and conductive metal in a 10% sulfuric acid solution.

* * * * *